US008583715B1

(12) United States Patent
Pan et al.

(10) Patent No.: US 8,583,715 B1
(45) Date of Patent: Nov. 12, 2013

(54) CONFIGURING A CIC FILTER IN A PROGRAMMABLE INTEGRATED CIRCUIT DEVICE

(75) Inventors: Zhengjun Pan, High Wycombe (GB); Volker Mauer, Princes Risborough (GB)

(73) Assignee: Altera Corporation, San Jose, CA (US)

( * ) Notice: Subject to any disclaimer, the term of this patent is extended or adjusted under 35 U.S.C. 154(b) by 1353 days.

(21) Appl. No.: 11/934,149

(22) Filed: Nov. 2, 2007

(51) Int. Cl.
*G06F 17/10* (2006.01)

(52) U.S. Cl.
USPC .......................................................... 708/300

(58) Field of Classification Search
None
See application file for complete search history.

(56) References Cited

U.S. PATENT DOCUMENTS 5,596,609 A * 1/1997 Genrich et al. ............... 375/350

OTHER PUBLICATIONS

Fredric J. Harris, Cascade Integrator Comb Filters, from "Multirate Signal PRocessing for Communication systems" www.informit.com/articles/article.aspx?p=361985&seqNum=4; Apr. 1, 2005.*
Donadio, M.P., "CIC Filter Introduction," Jul. 18, 2000.

Hogenauer, E.B., "An Economical Class of Digital Filters for Decimation and Interpolation," *IEEE Transactions on Acoustics, Speech, and Signal Processing*, vol. ASSP-29, No. 2, pp. 155-162 (Apr. 1981).
Lyons, R., "Understanding cascaded integrator-comb filters," http://www.embedded.com/columns/showArticle.jhtml?articleID=160400592 (Mar. 31, 2005).
Mayer-Baese, U., *Digital Signal Processing with Field Programmable Gate Arrays*, 2nd Edition, Chapter 5, Section 5.3.4, pp. 196-201 (Spinger, 2004).
Wikipedia, "Cascaded integrator-comb filter," http://en.wikipedia.org/wiki/Cascaded_integrator-comb (accessed on Jul. 16, 2007).

* cited by examiner

*Primary Examiner* — Michael D Yaary
(74) *Attorney, Agent, or Firm* — Ropes & Gray LLP; Jeffrey H. Ingerman

(57) ABSTRACT

A programmable integrated circuit device can be configured as a cascaded integrator-comb (CIC) filter. In order to take advantage of Hogenauer pruning to configure the CIC filter efficiently, a software tool for configuring the device can be provided in which the $F_j$ terms for Hogenauer pruning have been calculated in advance for all possible user parameters supported by the tool. To configure a CIC filter, the user enters the parameters in the tool, which then looks up the $F_j$ terms corresponding to those parameters and completes the calculation of the $B_j$ terms for Hogenauer pruning. Because the calculation of the $F_j$ terms is the most time-consuming step in calculating of the $B_j$ terms, pre-calculation of the $F_j$ terms, which can be done just once by the provider of the tool, allows end users to calculate the $B_j$ terms in reasonable periods of time, making Hogenauer pruning available to end users.

24 Claims, 3 Drawing Sheets

CONFIGURING A CIC FILTER IN A PROGRAMMABLE INTEGRATED CIRCUIT DEVICE

BACKGROUND OF THE INVENTION

This invention relates to programmable integrated circuit devices, such as programmable logic devices (PLDs), and, more particularly, to configuring such a device as a CIC filter.

As applications for which programmable integrated circuit devices, such as PLDs, are used increase in complexity, it has become more common to design such devices to include specialized processing blocks in addition to blocks of generic programmable logic resources. Such specialized processing blocks may include a concentration of circuitry on a programmable device that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

Taking PLDs as one example, one particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, PLDs sold by Altera Corporation, of San Jose, Calif., as part of the STRATIX® family include DSP blocks, each of which includes four 18-by-18 multipliers. Each of those DSP blocks also includes adders and registers, as well as programmable connectors (e.g., multiplexers) that allow the various components to be configured in different ways. In each such block, the multipliers can be configured not only as four individual 18-by-18 multipliers, but also as four smaller multipliers, or as one larger (36-by-36) multiplier. In addition, one 18-by-18 complex multiplication (which decomposes into two 18-by-18 multiplication operations for each of the real and imaginary parts) can be performed.

Such a DSP block may be configured as a finite impulse response (FIR) filter, with 18-bit data and coefficients. Each block may be used to perform the summation of four 18-by-18 multiplications to form a 4-tap sub-block of a longer FIR filter.

Many types of FIR filters may be encountered. Two of those types are an interpolation FIR filter—in which the number of samples is increased by a factor of n by inserting ("interpolating") n−1 samples between adjacent samples—and a decimation FIR filter—in which the number of samples is decreased by a factor of n by removing n−1 out of every n samples. A DSP block that may be configured as different types of filters, including an interpolation FIR filter and a decimation FIR filter, is shown in copending, commonly-assigned U.S. patent application Ser. No. 11/447,370, filed Jun. 5, 2006, which is hereby incorporated by reference herein in its entirety.

One particular type of interpolation or decimation filter is the cascaded integrator-comb ("CIC") filter. A CIC filter can be used as an alternative to a FIR filter, and has the advantage that it can be implemented without multipliers. For high decimation or interpolation factors, the required bit width for full precision may be too large for most practical cases. To reduce the output bit width, quantization is typically applied at the output stage. Based on the nature of decimation filters, Hogenauer developed a pruning strategy to reduce the required bit widths at each stage through truncation or rounding in such a way that the total error introduced will not exceed the quantization error introduced through simple output quantization.

If one were constructing a dedicated CIC filter, there would be a known finite number of stages for which the Hogenauer bit width reductions would have to be calculated. However, in the case of a user-programmable device, the tools provided to the user to program the device must be capable of calculating any number of Hogenauer bit width reductions for any number of CIC filter stages that a user may decide to configure the device as. The calculation of all possible factors could take weeks on the types of computers—i.e., desktop computers—that most programmable device users are likely to use for device configuration.

SUMMARY OF THE INVENTION

The present invention provides users with a configuration tool for programmable devices, which tool allows the user to compute the Hogenauer bit width reductions in a reasonable period of time. This is achieved by pre-calculating certain terms used in computation of the Hogenauer bit width reductions and providing those pre-calculated terms as part of the tool.

Therefore, in accordance with the present invention, there is provided a method of programmably configuring a programmable integrated circuit device as a CIC filter structure. In accordance with the method, the programmable integrated circuit device is provided along with a software tool for configuring the programmable integrated circuit device as said CIC filter structure based on CIC filter parameters N, R, M, $B_{in}$ and $B_{out}$, where N is number of interpolation/decimation pairs or stages, R is interpolation/decimation rate, M is differential delay, $B_{in}$ is input bit width and $B_{out}$ is output bit width. As part of the method, the software tool is created by defining a respective range supported by said tool for each of the CIC filter parameters N, R, and M, calculating possible variance error gain terms $F_j$ for Hogenauer pruning for those ranges of CIC filter parameters N, R, M, and storing the calculated possible $F_j$ terms for Hogenauer pruning in association with the software tool. Input, into the software tool, of particular CIC filter parameters N, R, M, $B_{in}$ and $B_{out}$, is accepted. $F_j$ terms, corresponding to the particular CIC filter parameters N, R, and M, are recalled from among the stored calculated possible $F_j$ terms. For each stage j a bit width term, $B_j$, for Hogenauer pruning for a CIC filter is calculated from the recalled $F_j$ terms and the $B_{in}$ and $B_{out}$ terms.

Methods of creating the software tool, and of using the software tool to programmably configure a programmable integrated circuit device, as well as a data storage medium encoded with the software tool, are also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
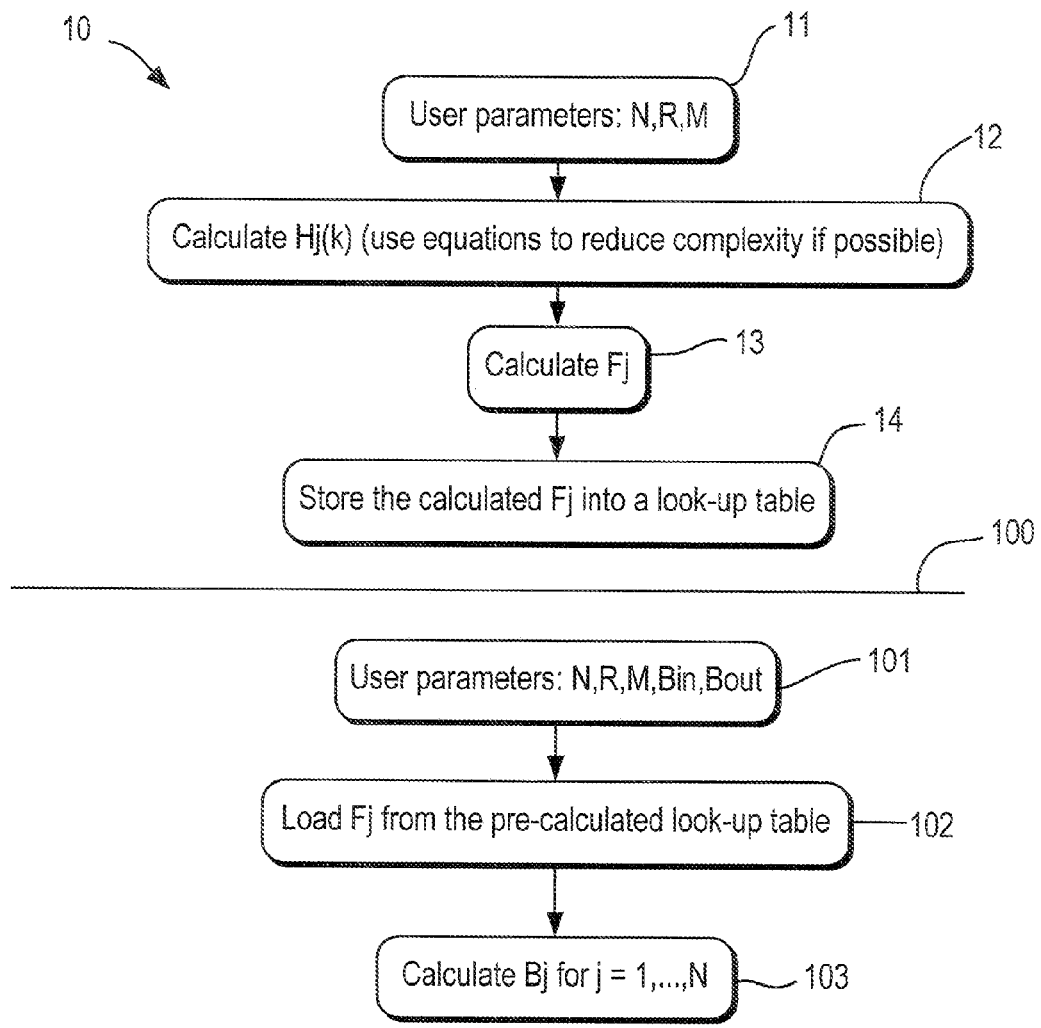
FIG. 1 is a flow diagram of preferred embodiment of a method according to the present invention.

In a CIC filter, if N is the number of interpolator or decimator pairs, and $\sigma T_j^2$, $j=1, 2, \ldots, 2N+1$ is the quantization noise introduced through pruning in the stage j, then according to Hogenauer pruning:

$$\sum_{j=1}^{2N} \sigma_{T,j}^2 \leq \sigma_{T,2N+1}^2, \qquad \text{Equation (1)}$$

where $\sigma_{T,2N+1}^2 = \frac{1}{12} 2^{2B_{2N+1}} = \frac{1}{12} 2^{2(B_{in}-B_{out})}$, and $B_{in}$ and $B_{out}$ are the data widths of the input and output respectively.

The total noise introduced by Hogenauer pruning can then be calculated as:

$$\sum_{j=1}^{2N} \sigma_{T,j}^2 \leq \sum_{j=1}^{2N} \sigma_j^2 F_j^2, \qquad \text{Equation (2)}$$

where $F_j^2 \begin{cases} \sum_{k=0}^{(RM-1)N+j-1} h_j^2(k), & j = 1, 2, \ldots, 2N \\ 1, & j = 2N+1 \end{cases}$ is the variance error gain from stage j to the output, and $$h_j(k) = \qquad \text{Equation (3)}$$

$$\begin{cases} \sum_{l=0}^{\lfloor k/RM \rfloor} (-1)^l \binom{N}{l} \binom{N-j+k-RMl}{k-RMl}, & j = 1, 2, \ldots, N \\ (-1)^k \binom{2N+1-j}{k}, & j = N+1, \ldots, 2N \end{cases}$$

If one introduces the constraint that $$\sigma_{T,j}^2 \leq \frac{1}{2N} \sigma_{T,2N+1}^2, \quad j = 1, 2, \ldots, 2N$$

then the number of LSB bits which should be pruned at stage j is:

$$B_j = \left\lfloor -\log_2 F_j + \log_2(\sigma_{T,2N+1}) + 0.5 \log_2\left(\frac{6}{N}\right) \right\rfloor \qquad \text{Equation (4)}$$

As discussed above, it is difficult for providers of configuration tools for programmable devices to make Hogenauer pruning available to users. Such tools typically allow users to program a device by entering parameters. For a CIC filter, these parameters may include the input bit width, number of stages, differential delay, and desired output bit width. Once the user enters all parameters, a calculation runs in the background to optimize the bit width of each stage based on these inputs. On typical desktop computers, this process could take weeks of CPU time to generate the $B_j$ for each parameter combination, which is unacceptable for most users.

As a result, existing programmable device configuration tools typically take one of three approaches with respect to configuration of CIC filters in the programmable devices.

Some known tools perform all of the calculations, accepting long computation times. However, these tools really are suitable only for specific configurations, rather than generic user logic designs.

Other known tools do not support Hogenauer pruning at all, accepting instead the inefficiencies of greater hardware utilization.

It also may be possible to create a tool that would provide a middle ground where the bit widths would have been pre-calculated for a limited number of parameter combinations. Users of such a tool would be prevented from using other parameter combinations, or would be required to accept the unavailability of Hogenauer pruning—and the resulting hardware inefficiencies—for those other combinations.

In accordance with the present invention, a tool is provided that allows a user to compute, in a reasonable amount of time, the Hogenauer bit width reductions for any desired CIC filter parameter combination. This is accomplished by breaking up the calculation into two stages.

In a first stage, a large number of terms that are generic to all or substantially all parameter combinations are computed and are included in the tool. For example, they may be included in a look-up table. This stage is performed once by the provider of the programmable device configuration tool (who generally is the provider of the programmable device itself). Although this step is time-consuming, it is nevertheless orders of magnitude less time-consuming than pre-calculating all possible bit width reductions, and may be performed by the configuration tool supplier in a reasonable time, particularly if parallel processing is used.

The second stage is performed by the user using the tool. The user preferably can calculate the bit width reductions for any parameter combination. The necessary terms may be retrieved from the look-up table and the remaining calculations may be performed in a relatively short time.

Specifically, because the aforementioned variance error gains $F_j^2$ are correlated to N, R and M, but not to $B_{in}$ and $B_{out}$, the algorithm for calculating $B_j=f(N,R,M,B_{in},B_{out})$ may be broken into two separate steps:

$$F_j=f(N,R,M)$$

$$B_j=f(B_{in},B_{out},N,F_j)$$

This allows the various F terms to be pre-calculated and stored in a lookup table. The calculation of the F terms is the most time-consuming individual part of the Hogenauer pruning calculation. When the F terms can be retrieved from a lookup table, the $B_j$ terms can be calculated relatively quickly by the user using, e.g., a desktop computer.

For example, consider the following parameter ranges for a CIC filter:

N: 1-12, R: 2-32000, M: 1-2, $B_{in}$: 1-32, $B_{out}$1: 224):

If a lookup table for all possible $B_j$ values were supported, this would require more than 20 GB. The time to generate the look-up table would be about 70,000 days of CPU time. This would not be practical for the tool provider, let alone for a user.

If no lookup table were used, it would take several hours on a desktop computer, of the type that a typical user might use, to calculate the formulae for a single parameter set, and each user design requires multiple parameter sets. Although this could be reduced to several minutes per parameter set using an acceleration technique described below, it would still require several minutes per parameter set, which may still be unacceptably long.

Using the method of the present invention, a look-up table for storing the various F terms may require only 20 MB if compressed in the manner described below, while the availability of that look-up table may reduce the calculation time of the $B_j$ terms for each parameter set to seconds of CPU time on a desktop computer. While the calculation of the look-up table may require about 70 days (i.e., about 1700 hours) of CPU time using the acceleration technique described below, that may be acceptable if performed only once, centrally by the provider of the tool, particularly if that calculation can be performed in parallel on multiple computers, reducing the total actual time to as little as a few days or a week.

In accordance with another aspect of the invention, the look-up table may be compressed by converting the stored values from floating point numbers, which require 8 bytes to store, to 32-bit integers which require only 4 bytes to store, because values beyond the sixth decimal place are not expected to make a meaningful contribution to the bit width calculations. In addition, relative addressing can be used to avoid the need for storing the indices of the various terms. This may reduce the file size of the look-up table from, e.g., about 60 MB to, e.g., about 20 MB.

In accordance with another aspect of the invention, as discussed above, the calculation of the F terms for the look-up table can be accelerated even further. The most time-consuming part of the F calculation is the calculation of the h(k) terms for a large decimation factor R. For example, the Quartus® PLD programming tool provided by Altera Corporation supports decimation factors R as large as 32,000.

In accordance with this aspect of the invention, the calculation of the h(k) terms may be simplified by more than one order of magnitude, as follows:

$$h_j^N(0) = 1, j = 1, 2, \ldots, N$$

$$h_j^N(k+1) = \sum_{l=0}^{\lfloor k/RM \rfloor} (-1)^l \binom{N}{l}\binom{N-j+k+1-RMl}{k+1-RMl}$$

$$= \sum_{l=0}^{\lfloor k/RM \rfloor} (-1)^l \binom{N}{l}\left\{\binom{N-j+k+1-RMl}{k-RMl} + \binom{N-j+k-RMl}{k+1-RMl}\right\}$$

$$= h_j^N(k) + h_{j+1}^N(k+1)$$

$$h_{j+1}^N(k+1) = h_{j+1}^N(k+1) - h_j^N(k)$$

In this way each $h_{j+1}(k)$ is calculated from a corresponding $h_j(k)$ (this can also be described as calculating each $h_j(k)$ from a corresponding $h_{j-1}(k)$). By calculating each $h_j(k)$ from $h_{j-1}$ (k), the complexity of the $h_j(k)$ calculation is reduced by a factor of N. In addition, the $h_j(k)$ terms may have the following property:

$$h_j^N(k) = (-1)^{j-1} h_j^N(RMN-N+j-1-k)$$

According to this property, the magnitudes of the $h_j(k)$ terms are symmetrical, although the signs may differ (as reflected by the $(-1)^{j-1}$ factor). One may rely on this symmetrical nature of the magnitudes of the $h_j(k)$ to calculate each one of half of the $h_j(k)$ terms from its symmetric counterpart, further reducing the complexity of the calculation by a factor of 2.

The flow chart in FIG. 1 shows how a method 10 according to the invention may be used to calculate $F_j$ at the tool provider, where they are stored into a look-up table, and then used by the end user to calculate $B_j$.

In FIG. 1, the steps above line 100 are carried out by the tool developer/provider, while the steps below line 100 are carried out by the end user. At step 11, the limits of the various user parameters N, R, M, are defined. Thus, in the example above, those limits may be:

N: 1-12, R: 2-32000, M: 1-2.

At step 12, the various $h_j(k)$ for all combinations of those parameters are calculated. As discussed above, the aforementioned acceleration techniques may be used to reduce the complexity of, and/or the time required for, the $h_j(k)$ calculations. Once the various $h_j(k)$ have been calculated, the various $F_j$ terms are calculated at step 13, using the equations discussed above. At step 14, those $F_j$ terms are stored in a look-up table, which is incorporated into, or sold with, the tool. At that point, the involvement of the tool developer/provider ends.

With the tool in the hands of an end user and loaded into a user computer, such as a desktop computer, at step 101, the end user specifies the particular desired parameters N, R, M, $B_{in}$, $B_{out}$. At step 102, the various $F_j$ terms corresponding to the user's combination of parameters are recalled from the look-up table. At step 103, the various $B_j$ terms are calculated using Equation (4), above, in which the $F_j$ terms are functions of N, R and M according to Equations (2) and (3) above, and $\sigma_{T,2N+1}^2$ is a function of $B_{in}$, $B_{out}$ and N according to Equation (1) above. As discussed above, freed from having to calculate the $F_j$ terms, the user's computer—even a desktop computer—should be able to compute each $B_j$ term in a matter of seconds.

The tool preferably is part of a larger software tool for programming programmable integrated circuit devices such as PLDs, and can be used as part of that larger programming tool to program a programmable device, such as that described in above-incorporated application Ser. No. 11/447,370, as a CIC filter.

Thus it is seen that a tool allowing a user to configure a specialized processing block of a programmable device as a CIC filter has been provided.

Figure 2:
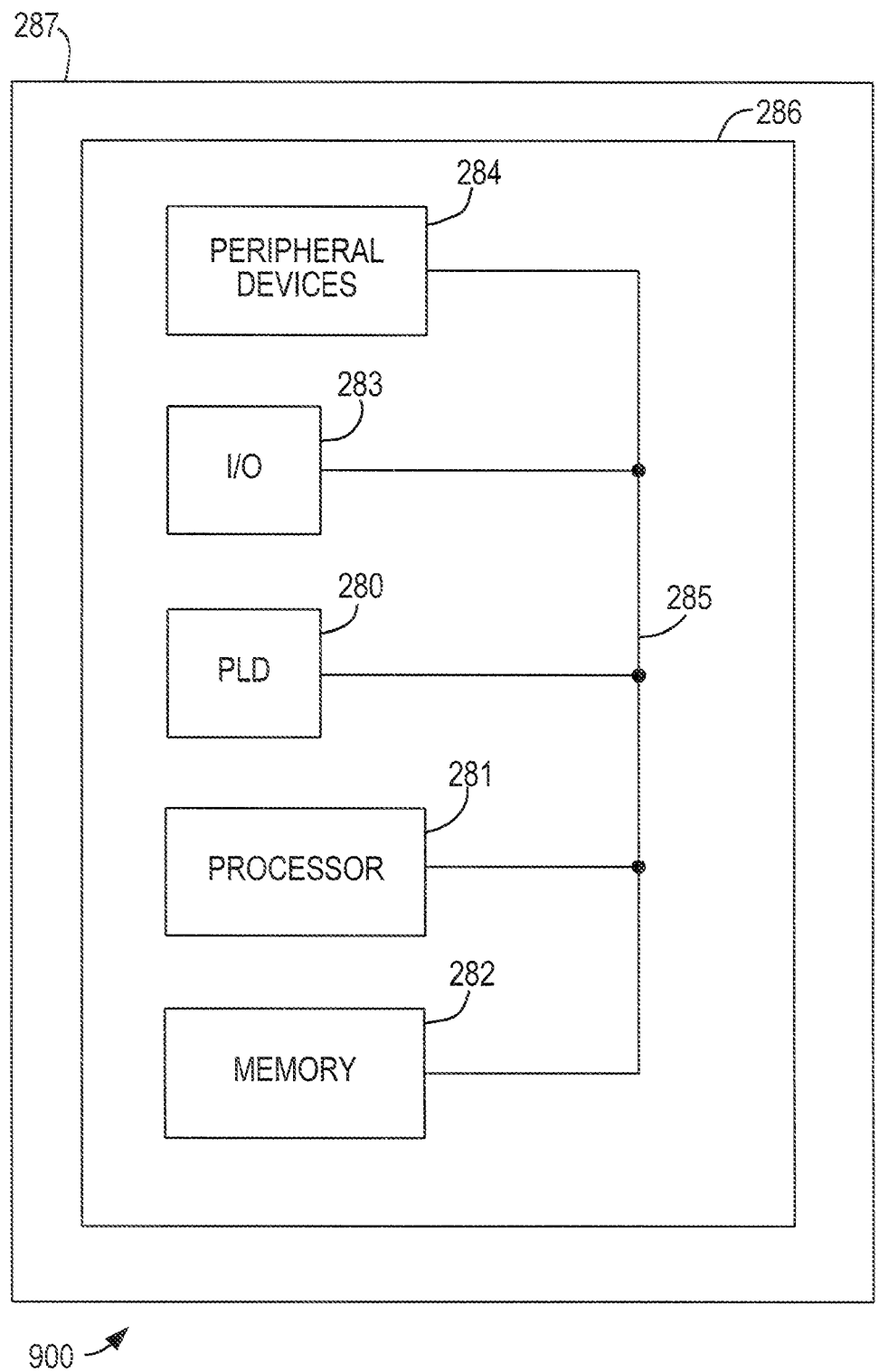
FIG. 2 is a simplified block diagram of an illustrative system employing a programmable logic device configured in accordance with the present invention.

A PLD 280 incorporating such a specialized processing block and programmed according to the present invention may be used in many kinds of electronic devices. One possible use is in a data processing system 900 shown in FIG. 2. Data processing system 900 may include one or more of the following components: a processor 281; memory 282; I/O circuitry 283; and peripheral devices 284. These components are coupled together by a system bus 285 and are populated on a circuit board 286 which is contained in an end-user system 287.

System 900 can be used in a wide variety of applications, such as computer networking, data networking, instrumentation, video processing, digital signal processing, or any other application where the advantage of using programmable or reprogrammable logic is desirable. PLD 280 can be used to perform a variety of different logic functions. For example, PLD 280 can be configured as a processor or controller that works in cooperation with processor 281. PLD 280 may also be used as an arbiter for arbitrating access to a shared resources in system 900. In yet another example, PLD 280 can be configured as an interface between processor 281 and one of the other components in system 900. It should be noted that system 900 is only exemplary, and that the true scope and spirit of the invention should be indicated by the following claims.

Various technologies can be used to implement PLDs 280 or other programmable devices as described above and incorporating this invention.

Instructions for carrying out the method according to this invention may be encoded on a machine-readable medium, to be executed by a suitable computer or similar device to implement the method of the invention for programming programmable integrated circuit devices such as PLDs. For example, a personal computer may be equipped with an interface to which a PLD or other programmable device can be connected, and the personal computer can be used by a user to program the PLD or other programmable device using a suitable software c) tool, such as the QUARTUS® II software available from Altera Corporation, of San Jose, Calif., into which the present invention has been incorporated.

Figure 3:
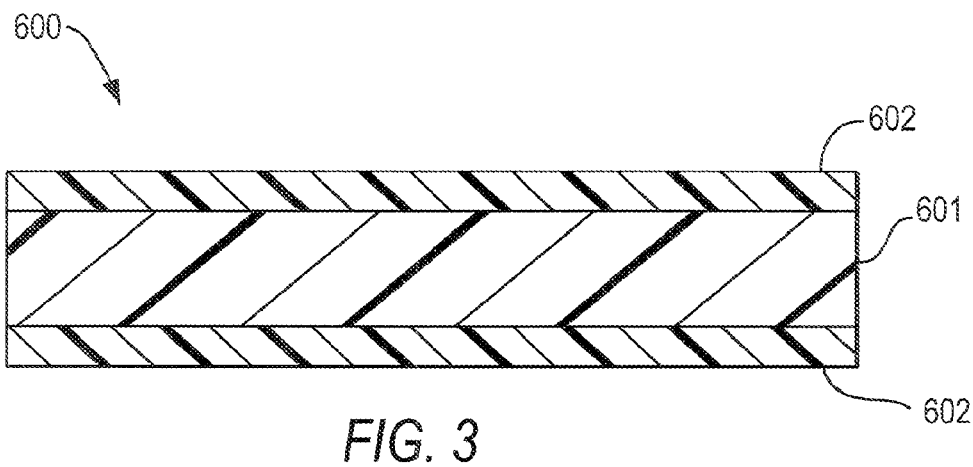
FIG. 3 is a cross-sectional view of a magnetic data storage medium encoded with a set of machine-executable instructions for performing the method according to the present invention.

FIG. 3 presents a cross section of a magnetic data storage medium 600 which can be encoded with a machine executable program that can be carried out by systems such as the aforementioned personal computer, or other computer or similar device. Medium 600 can be a floppy diskette or hard disk, or magnetic tape, having a suitable substrate 601, which may be conventional, and a suitable coating 602, which may be conventional, on one or both sides, containing magnetic domains (not visible) whose polarity or orientation can be altered magnetically. Except in the case where it is magnetic tape, medium 600 may also have an opening (not shown) for receiving the spindle of a disk drive or other data storage device.

The magnetic domains of coating 602 of medium 600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, as a filter in accordance with the invention.

Figure 4:
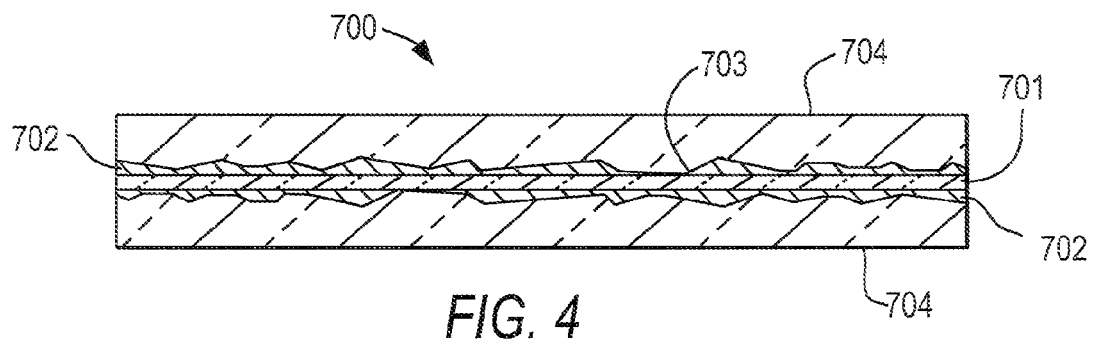
FIG. 4 is a cross-sectional view of an optically readable data storage medium encoded with a set of machine executable instructions for performing the method according to the present invention.

FIG. 4 shows a cross section of an optically-readable data storage medium 700 which also can be encoded with such a machine-executable program, which can be carried out by systems such as the aforementioned personal computer, or other computer or similar device. Medium 700 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 700 preferably has a suitable substrate 701, which may be conventional, and a suitable coating 702, which may be conventional, usually on one or both sides of substrate 701.

In the case of a CD-based or DVD-based medium, as is well known, coating 702 is reflective and is impressed with a plurality of pits 703, arranged on one or more layers, to encode the machine-executable program. The arrangement of pits is read by reflecting laser light off the surface of coating 702. A protective coating 704, which preferably is substantially transparent, is provided on top of coating 702.

In the case of magneto-optical disk, as is well known, coating 702 has no pits 703, but has a plurality of magnetic domains whose polarity or orientation can be changed magnetically when heated above a certain temperature, as by a laser (not shown). The orientation of the domains can be read by measuring the polarization of laser light reflected from coating 702. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of programmably configuring a programmable integrated circuit device as a CIC filter structure, said method comprising:

accepting input, into a software tool for configuring said programmable integrated circuit device as said CIC filter structure, of particular values of CIC filter parameters N, R, M, $B_{in}$ and $B_{out}$, where N is number of interpolation/decimation pairs or stages, R is interpolation/decimation rate, M is differential delay, $B_{in}$ is input bit width and $B_{out}$ is output bit width;

recalling variance error gain terms $F_j$, corresponding to said particular values of CIC filter parameters N, R, and M, from among possible $F_j$ terms that were previously calculated for various values of N, R, and M, and were stored in association with said software tool, said particular values being among said various values; and from said recalled variance error gain terms $F_j$ and said $B_{in}$ and $B_{out}$ terms, calculating for each stage j a bit width term, $B_j$, for Hogenauer pruning for a CIC filter; wherein:

said software tool is created by:

defining a respective range, for said various values of each of said CIC filter parameters N, R, and M, supported by said tool, pre-calculating possible variance error gain terms $F_j$ for Hogenauer pruning for said various values in said respective ranges of CIC filter parameters N, R, M, and storing said pre-calculated possible variance error gain terms $F_j$ for Hogenauer pruning in association with said software tool.

2. The method of claim 1 wherein said pre-calculating possible variance error gain terms $F_j$ for Hogenauer pruning for said various values in said respective ranges of CIC filter parameters N, R, M, comprises:

pre-calculating possible $h_j(k)$ terms for Hogenauer pruning for said various different values in said respective ranges of CIC filter parameters N, R, M; and pre-calculating possible variance error gain terms $F_j$ for Hogenauer pruning from said possible $h_j(k)$ terms.

3. The method of claim 2 further comprising accelerating said pre-calculating of possible $h_j(k)$ terms for Hogenauer pruning.

4. The method of claim 3 wherein said accelerating said pre-calculating of possible $h_j(k)$ terms for Hogenauer pruning comprises pre-calculating each $h_j(k)$ term from a corresponding $h_{j-1}(k)$ term.

5. The method of claim 3 wherein:
said $h_j(k)$ terms are symmetric in magnitude; and
said accelerating said pre-calculating of possible $h_j(k)$ terms for Hogenauer pruning comprises pre-calculating each $h_j(k)$ term from a symmetric counterpart thereof.

6. The method of claim 1 wherein said storing comprises storing said pre-calculated possible variance error gain terms $F_j$ for Hogenauer pruning in a look-up table in said software tool.

7. The method of claim 1 wherein said programmable integrated circuit device is a programmable logic device.

8. A method of creating a software tool for programmably configuring a programmable integrated circuit device as a CIC filter structure, said method comprising:
defining a respective range of values of each of CIC filter parameters N, R, M, that are supported by said software tool, where N is number of interpolation/decimation pairs or stages, R is interpolation/decimation rate, and M is differential delay;
pre-calculating possible $h_j(k)$ terms for Hogenauer pruning for various values in said respective ranges of each of said CIC filter parameters N, R, M;
pre-calculating possible variance error gain terms $F_j$ for Hogenauer pruning for said various values in said respective ranges values of each of said CIC filter parameters N, R, M from said possible $h_j(k)$ terms; and
storing said pre-calculated possible variance error gain terms $F_j$ for Hogenauer pruning in association with said software tool.

9. The method of claim 8 further comprising accelerating said pre-calculating of possible $h_j(k)$ terms for Hogenauer pruning.

10. The method of claim 9 wherein said accelerating said pre-calculating of possible $h_j(k)$ terms for Hogenauer pruning comprises pre-calculating each $h_j(k)$ term from a corresponding $h_{j-1}(k)$ term.

11. The method of claim 9 wherein:
said $h_j(k)$ terms are symmetric in magnitude; and
said accelerating said pre-calculating of possible $h_j(k)$ terms for Hogenauer pruning comprises pre-calculating each $h_j(k)$ term from a symmetric counterpart thereof.

12. The method of claim 8 wherein said storing comprises storing said pre-calculated possible variance error gain terms $F_j$ for Hogenauer pruning in a look-up table in said software tool.

13. The method of claim 12 wherein said storing comprises compressing said look-up table.

14. The method of claim 13 wherein said compressing comprises converting said pre-calculated possible variance error gain terms $F_j$ for Hogenauer pruning from floating point numbers to integers.

15. The method of claim 8 wherein said programmable integrated circuit device is a programmable logic device.

16. A method of programmably configuring a programmable integrated circuit device as a CIC filter structure, using a software tool created by:
defining respective ranges of CIC filter parameters N, R, M, that are supported by said software tool, where N is number of interpolation/decimation pairs or stages, R is interpolation/decimation rate, and M is differential delay,
pre-calculating possible variance error gain terms $F_j$ for Hogenauer pruning for said various values of CIC filter parameters N, R, M within said respective ranges, and
storing said pre-calculated possible $F_j$ terms for Hogenauer pruning in association with said software tool; said method comprising:
accepting input, into said software tool, of particular values of CIC filter parameters N, R, M, $B_{in}$ and $B_{out}$, where $B_{in}$ is input bit width and $B_{out}$ is output bit width,
recalling variance error gain terms $F_j$, corresponding to said particular values of CIC filter parameters N, R, and M, from among said stored possible variance error gain terms $F_j$ that were previously calculated for said various values of N, R, and M; and
from said recalled variance error gain terms $F_j$ and said $B_{in}$ and $B_{out}$ terms, calculating for each stage j a bit width term, $B_j$, for Hogenauer pruning for a CIC filter.

17. The method of claim 16 wherein said recalling comprises recalling said pre-calculated possible variance error gain terms $F_j$ for Hogenauer pruning from a look-up table in said software tool.

18. The method of claim 16 wherein said programmable integrated circuit device is a programmable logic device.

19. A non-transitory data storage medium encoded with machine-executable instructions for performing a method of programmably configuring a programmable logic device as a CIC filter structure, said instructions comprising:
instructions to accept input of particular values of CIC filter parameters N, R, M, from within respective supported ranges of values, and particular values of CIC filter parameters $B_{in}$ and $B_{out}$, where N is number of interpolation/decimation pairs or stages, R is interpolation/decimation rate, M is differential delay, $B_{in}$ is input bit width and $B_{out}$ is output bit width;
instructions to recall variance error gain terms $F_j$, corresponding to said particular values of said CIC filter parameters N, R, and M, from among pre-calculated possible variance error gain terms $F_j$ stored on said data storage medium; and
instructions to calculate for each stage j, from said recalled variance error gain terms $F_j$ and said particular values of said $B_{in}$ and $B_{out}$ terms, a bit width term $B_j$ for Hogenauer pruning for a CIC filter.

20. The non-transitory data storage medium of claim 19 wherein said stored pre-calculated possible variance error gain terms $F_j$ are encoded in a look-up table.

21. The non-transitory data storage medium of claim 19 wherein said data storage medium is encoded by a method comprising pre-calculating said possible variance error gain terms $F_j$, said pre-calculating comprising:
pre-calculating possible $h_j(k)$ terms for Hogenauer pruning for respective supported ranges of CIC filter parameters N, R, M; and
pre-calculating possible variance error gain terms $F_j$ for Hogenauer pruning from said possible $h_j(k)$ terms.

22. The non-transitory data storage medium of claim 21 wherein said method of encoding further comprises accelerating said pre-calculating of possible $h_j(k)$ terms for Hogenauer pruning.

23. The non-transitory data storage medium of claim 22 wherein, in said method of encoding, said accelerating said pre-calculating of possible $h_j(k)$ terms for Hogenauer pruning comprises pre-calculating each $h_j(k)$ term from a corresponding $h_{j-1}(k)$ term.

24. The non-transitory data storage medium of claim 22 wherein:
said $h_j(k)$ terms are symmetric in magnitude; and
in said method of encoding, said accelerating said pre-calculating of possible $h_j(k)$ terms for Hogenauer pruning comprises pre-calculating each $h_j(k)$ term from a symmetric counterpart thereof.

* * * * *